(12) United States Patent
Dally et al.

(10) Patent No.: US 8,742,796 B2
(45) Date of Patent: Jun. 3, 2014

(54) LOW ENERGY FLIP-FLOPS

(75) Inventors: William Dally, Stanford, CA (US); Jonah Alben, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 369 days.

(21) Appl. No.: 13/008,894

(22) Filed: Jan. 18, 2011

(65) Prior Publication Data
US 2012/0182056 A1 Jul. 19, 2012

(51) Int. Cl.
*G01R 19/00* (2006.01)

(52) U.S. Cl.
USPC ................... 327/51; 327/55; 327/57

(58) Field of Classification Search
None
See application file for complete search history.

(56) References Cited

U.S. PATENT DOCUMENTS

| | | | | |
|---|---|---|---|---|
| 4,256,411 A * | 3/1981 | Podosek | | 402/73 |
| 5,821,791 A * | 10/1998 | Gaibotti et al. | | 327/202 |
| 5,903,171 A * | 5/1999 | Shieh | | 327/55 |
| 6,310,501 B1 * | 10/2001 | Yamashita | | 327/215 |
| 6,396,309 B1 | 5/2002 | Zhao et al. | | |
| 6,472,920 B1 * | 10/2002 | Cho et al. | | 327/215 |
| 6,580,411 B1 | 6/2003 | Kubota et al. | | |
| 6,714,060 B2 | 3/2004 | Araki | | |
| 6,747,485 B1 * | 6/2004 | Suryanarayana et al. | | 327/51 |
| 7,057,421 B2 * | 6/2006 | Shi et al. | | 327/55 |
| 7,196,552 B2 * | 3/2007 | Zhou | | 327/65 |
| 7,304,903 B2 * | 12/2007 | Mukhopadhyay et al. | | 365/205 |
| 7,760,117 B1 * | 7/2010 | Chou | | 341/136 |
| 2004/0160244 A1 * | 8/2004 | Kim | | 327/55 |
| 2005/0040856 A1 | 2/2005 | Ramaraju et al. | | |
| 2006/0049852 A1 * | 3/2006 | Park et al. | | 327/55 |

FOREIGN PATENT DOCUMENTS

JP 2004214997 7/2004

* cited by examiner

*Primary Examiner* — Tuan T Lam

(57) ABSTRACT

Embodiments of the present technology are directed toward circuits for gating pre-charging sense nodes within a flip-flop when an input data signal changes and a clock signal is in a given state. Embodiments of the present technology are further directed toward circuits for maintaining a state of the sense nodes.

19 Claims, 17 Drawing Sheets

LOW ENERGY FLIP-FLOPS

BACKGROUND OF THE INVENTION

A number of electronic circuits utilize flip-flops that have a state that can be set or changed depending upon the state of one or more inputs and optionally one or more outputs. A flip-flop can be utilized as a data storage element, a counter, a timing element, and/or the like.

Referring to FIG. 1, an exemplary data flip-flop according to the conventional art is shown. The exemplary data flip-flop includes a first input for receiving an input data signal d, a second input for receiving a clock signal clk and an output q. The state of the output q changes in response to a change of state of the input data signal d when the clock signal clk changes state.

Referring now to FIG. 2A, a first exemplary circuit of a data flip-flop according to the conventional art is shown. The exemplary data flip-flop circuit includes a master latch sub-circuit 201, a slave latch sub-circuit 220, and optionally an output isolation sub-circuit 230. The output q changes state in response to a change in state of the input data signal d when the clock signal clk changes state.

Referring now to FIG. 2B, a second exemplary circuit of a data flip-flop according to the conventional art is shown. The exemplary data flip-flop circuit includes a master storage element sense amplifier sub-circuit 250, a slave latch sub-circuit 260, and optionally an output isolation sub-circuit 270. Again, the output q changes state in response to a change in state of the input data signal d when the clock signal clk changes state.

In a number of electronic circuits, the flip-flops consume a substantially portion of the power used by the electronic device. For example, a processor may include logic circuits, flip-flops, interface control group circuits, clock trees, random access memory and the like. FIG. 3 illustrates the dynamic energy consumed by the logic circuits, flip-flops, interface control group circuits, clock trees, and random access memory of an exemplary processor, such a central processing unit (CPU), graphics processing unit (GPU), digital signal processor (CPU) or the like. As illustrated, the flip-flop circuits may consume approximately one quarter of the power consumed during switching in the processor. Accordingly, to reduce power consumption in electronic devices there is a continuing need for improved flip-flops circuits.

SUMMARY OF THE INVENTION

The present technology may best be understood by referring to the following description and accompanying drawings that are used to illustrate embodiments of the present technology directed toward low energy flip-flops.

In one embodiment, a flip-flop device includes a clocked flip-flop core, an input-gated pre-charge sub-circuit, and a keeper sub-circuit. The input-gated pre-charge sub-circuit is adapted to charge a sense of the clocked flip-flop core when an input data signal changes states. The keeper sub-circuit is adapted to maintain a state of the sense node of the clocked flip-flop core when a clock signal is held in a given state.

In another embodiment, a flip-flop device includes a flip-flop core and an input-gated pre-charge sub-circuit. The flip-flop core includes a first input to receive a clock signal, a second input to receive a data signal and an output to produce an output signal. The input-gated pre-charge sub-circuit is adapted to charge a given sense node of the lip-flop core when the input data signal changes state. The flip-flop device may also include a keeper sub-circuit to maintain a state of one or both sense nodes of the flip-flop core when the clock signal is held in a given state.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

In this application, the use of the disjunctive is intended to include the conjunctive. The use of definite or indefinite articles is not intended to indicate cardinality. In particular, a reference to "the" object or "a" object is intended to denote also one of a possible plurality of such objects.

Figure 4:
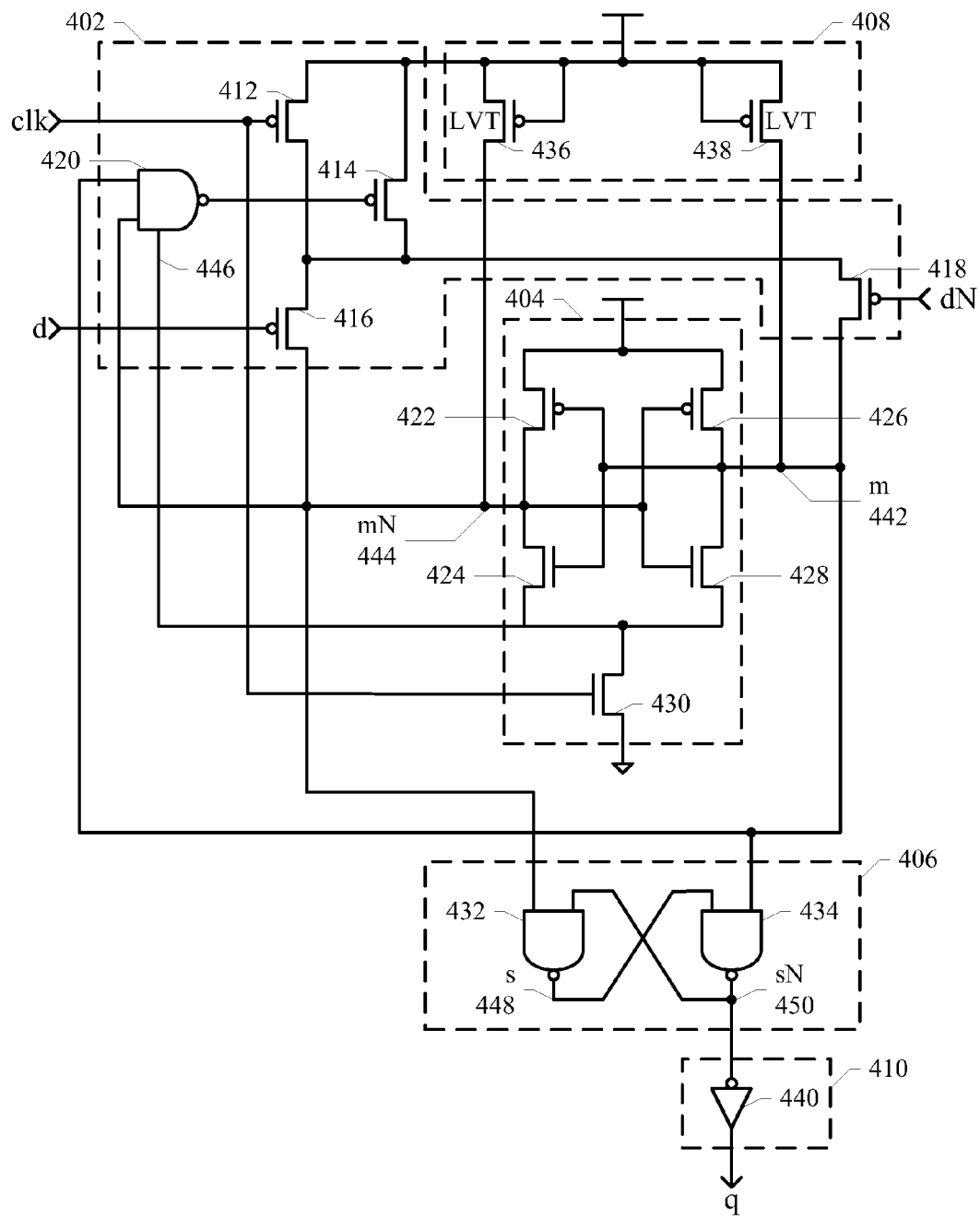
FIG. 4 shows a circuit diagram of a flip-flop including input-gated pre-charge (IGP), in accordance with one embodiment of the present technology.

Referring now to FIG. 4, a flip-flop circuit including input-gated pre-charge (IGP), in accordance with one embodiment of the present technology, is shown. The flip-flop may be an edge-triggered D-type flip-flop. The flip flop receives three inputs, a data input d, a compliment of the data input dN, and a clock input clk. The flip-flop produces output data q. The flip-flop includes an input-gated pre-charge sub-circuit 402, a master storage element sense amplifier sub-circuit 404, a slave latch sub-circuit 406, a keeper sub-circuit 408, and optionally an output isolation sub-circuit 410. The input-gated pre-charge 402 may include transistors 412-418 and NAND gate 420. The master storage element sense amplifier 404 may include transistors 422-430. The slave latch 406 may include NAND gates 432 and 434. The keeper 408 may include transistors 436 and 438 to hold the active sense nodes m 442 and mN 444 high when the clock is low. The output isolation 410 may include inverter 440. Generally, the master storage element sense amplifier sub-circuit 404, a slave latch sub-circuit 406, and optionally an output isolation sub-circuit 410 may be referred to as the flip-flop core circuit.

The input-gated pre-charge 402, in one implementation, includes a first second and third transistor 412, 416, and 418 operable to selectively couple the high-side supply potential to the sense node mN 444 as a function of the state of the clock signal clk and the input data signal d. The input-gated pre-charge 402 further includes a NAND gate 420 and a fourth transistor 414 operable to selectively couple the high-side supply potential to the sense nodes m 442 and mN 444 as a function of the input data signal and the state of the sense nodes m 442 and mN 444.

The input-gated pre-charge 402 provides an input-gated pre-charge function and a drive during sense function. When the clock input clk is low, transistor 402 is on, and the input-gated pre-charge 402 selectively charges sense nodes m 442 or mN 444 depending on the state of the input data d and dN. If the data input d is low, sense node 444 is charged via transistor 416. If dN is low, sense node 442 is pre-charged via transistor 418. Because the pre-charge is gated by the input, no nodes change state during pre-charge if he input has not changed state since the last clock cycle. The input-gated pre-charge by the input-gated pre-charge 402 significantly reduces clock energy for the flip flop.

If the input has changed since the last clock, both sense nodes 442 and 444 will be high when the clock input clk rises. With both sense nodes m 442 and mN 444 high, the output of NAND gate 420 is low and transistor 404 is on enabling the active input transistors 416 and 418 to provide drive to the master storage element sense amplifier 404 during sensing. When sensing is complete, one of sense node m 442 or mN 444 will go low causing the output of NAND gate 420 to go high and transistor 414 to turn off, ending the input drive. If the input changes after NAND gate 420 goes high, it will not affect the state of the master storage element sense amplifier 404 because the input drive has been removed.

The low supply 446 of the NAND gate 420 is tied to the drain of the clk transistor 430 rather then the low side supply potential (GND). This is done to prevent the NAND gate 420 from drawing current when the clock signal is low (e.g., clk=0) for long periods of time and one of sense nodes m 442 or mN 449 drifts to an intermediate voltage. If this drift is not a problem, the low supply of the NAND gate 420 can be tied directly to the low side supply potential (GND). Clock gating the pull-down (e.g., low-side supply potential) of the NAND gate 420 delays the input drive, which does not start until the gate of transistor 414 is pulled low. During this delay both sense nodes 442 and 444 will start being discharged. This is not an issue as long as the currents into and capacitances of the sense nodes are balanced.

When sense nodes 442 and 444 drift to an intermediate voltage, there will be not current drawn in the NAND gates 432 and 434 of the slave latch 406, since for sense nodes 442 or 444 that is drifting upward the other input of the slave latch 406 will be low.

The master storage element sense amplifier 404 may be a conventional sense amplifier. The master storage element sense amplifier 404 senses the input drive on the rising edge of the clock and drives the slave latch 406. When the clock signal clk rises, transistor 430 turns on providing the low side supply potential (GND) to the cross-coupled inverters formed by transistors 422-428. If the data input signal d has not changed since the last rising edge of the clock signal clk, the sense nodes 442 and 444 retain their previous states and hence the slave storage nodes s 448 and sN 450 also retain their previous states. The flip-flop consumes less energy, compared to conventional flip-flops, during clock only cycles because no internal nodes toggle.

If the data input d has changed since the last clock cycle, both sense node 442 and 444 will be high when the clock rises and the master storage element sense amplifier 404 senses the drive of the data input d. Consider the case where the flip-flop was in the low state (m=0, d=0, dN=1), and the data changes to the high state (e.g., d=1, dN=0). When both the clock signal clk and the compliment of the data signal dN are low, the sense node m 442 is charged to the high state through transistors 412 and 418. The setup time of the flip-flop needs to be sufficient to allow sense node m 442 to substantially charge high before the clock signal clk rises. At this point, both sense node m 442 and mN 444 are high, which does not affect the state of the state of the slave storage nodes s 448 and sN 450 of the slave latch 406.

When the clock signal clk rises, current is drawn from the common source node of transistors 424 and 428. The transistor pair 424 and 428 act as a differential amplifier to amplify the voltage difference $\Delta V$ between the sense nodes m 442 and mN 444. Initially, $\Delta V=0$, because both sense nodes m 442 and mN 444 are at the high supply potential Vdd, and transistors 424 and 428 draw equal current from sense node m 442 and mN 444. The compliment of the input signal dN drives transistor 418 to source current into sense node m 442, causing sense node mN 444 to fall faster than sense node m 442, thereby increasing $\Delta V$. As $\Delta V$ increases the differing gate voltage of transistors 424 and 428 act to increase the difference by giving differential drain current $\Delta i = gm \, \Delta V$. As soon as $\Delta V$ increases above the input-offset voltage of the master storage element sense amplifier 404, a decision is made and regeneration would complete even if the drive was removed by the compliment of the input data signal dN were removed at that point. Once sense node mN 444 falls below the threshold of NAND gate 420, the drive from the input data signal d is removed by transistor 414 and the cross coupled inverters 422-428 regenerate the difference between sense nodes m 442 and mN 444 until sense node m 442 is in a high state (m=1) and sense node mN 444 is in a low state (mN=1).

Because the master storage element sense amplifier 404 integrates differential current to generate a difference voltage, it is important that the capacitance of sense node m 442 and mN 444 be balanced as much as possible. A difference in node capacitance results in an input offset voltage for the master storage element sense amplifier 404.

While sense node m 442 in this case is momentarily pulled in both directions, correct operation of the circuit does not depend on ratios between the transistors. During the transient, sense node m 442 will fall more rapidly than sense node mN 444 as long as the current injected by transistors 414 and 418 is large enough to overcome the input offset voltage of the master storage element sense amplifier 404.

When the master storage element sense amplifier 404 takes on its new state, the slave latch 406 repeats this state since sense node mN 444 (mN=0) forces slave storage node s high (s=1 and sN=0). The slave latch 404 will hold this state until the next rising edge of the clock signal clk, even if the input data signal d changes again forcing both sense nodes m 442 and mN 444 high (m=mN=1).

Those skilled in the art appreciated that to allow operation with a single-ended input, an input inverter (not shown) can be provided to generate the compliment of the input data signal dN from input data signal d. Similarly, if true and complement output signals q and qN are desired, a compliment of the output signal qN can be generated with an inverter (not shown) from slave node s 448.

The keeper 408, in one implementation, includes a first and second leaky transistor 436 and 438 operable to maintain a state of the sense node m 442 and mN 444 when the clock signal clk is held in a given state. The leaky transistors 436 and 438 restore charge lost to leakage without a clock drive.

Figure 5:
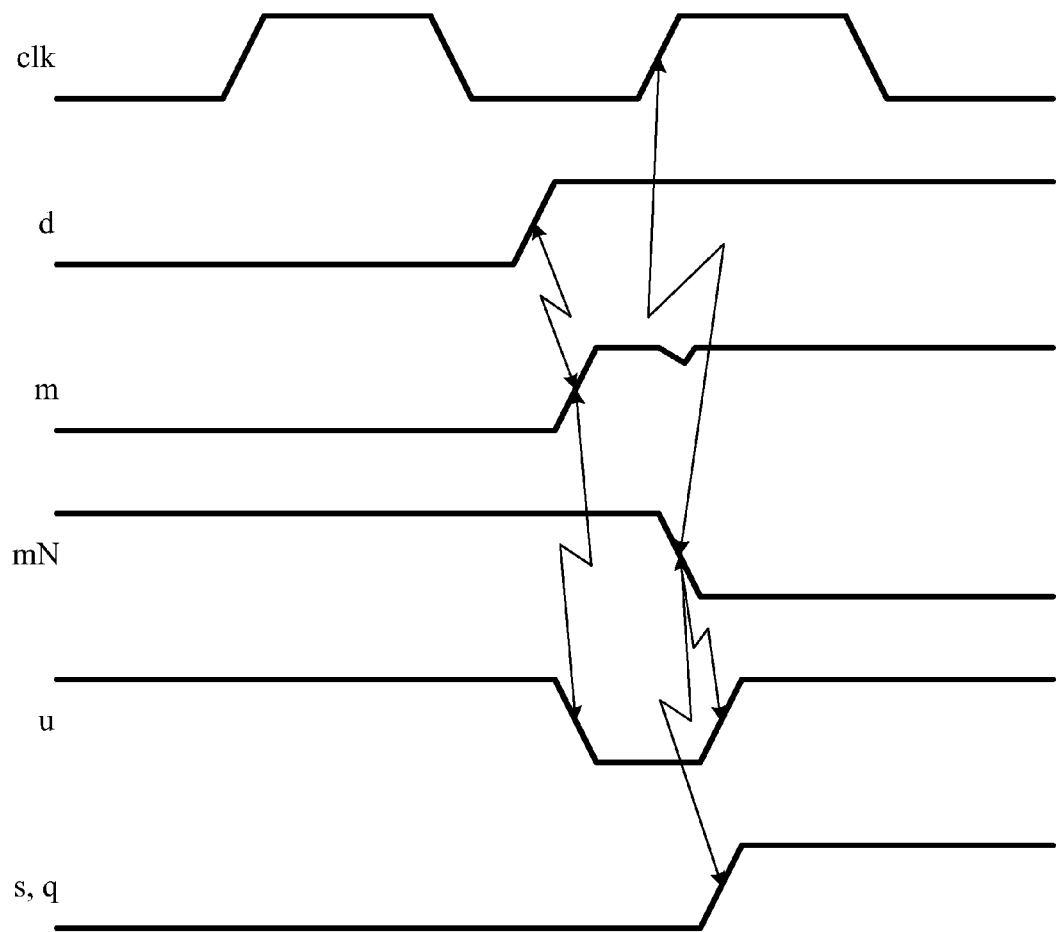
FIG. 5 shows exemplary waveforms illustrating operation of the flip-flop circuit including input-gated pre-charge (IGP), in accordance with one embodiment of the present technology.

Referring now to FIG. 5 along with FIG. 4, waveforms illustrating operation of the flip-flop circuit including input-gated pre-charge (IGP), in accordance with one embodiment of the present technology, is shown. In the timing diagram causality is denoted by arrows between signals. The timing diagram shows two cycles of the clock signal clk waveform. In the first cycle the input data signal d remains steady at a low state (d=0) and only the clock signal clk changes state. During the second cycle, input data signal d rises to a high state while the clock signal clk is at a low state (clk=0) driving sense node m 442 to a high state (m=1) and the flip-flop changes state as described above.

When input data signal d rises with the clock signal clk low, sense node m 442 rises which in turn causes the output of NAND gate 420 to fall. When the clock signal clk rises, sense node mN 444 falls and sense node m 442 dips slightly but is sustained by the input drive by transistor 414. As sense node mN 444 falls through the threshold of the NAND gate 420, the output of the NAND gate 420 rises, removing the input drive by transistor 414, and the slave latch 406 is set, driving output signal q high.

Accordingly, the value of the data input d is sampled and output on the data output q each time the clock signal clk rises. The input-gated pre-charge flip-flop circuit is static and can be paused indefinitely with the clock signal clk held high or low. During clock cycles with the data held constant, the clock nodes at the gates of transistors 412 and 430 switch while the other nodes of the IGP flip flop advantageously remain at a constant potential.

Gating the pre-charge of a dynamic circuit by the input data signal d enables the use of dynamic flip-flop topologies without the energy cost of pre-charging and discharging internal nodes on cycles when the input does not change.

The transistors 436 and 438 of keeper 408 acts to hold the sense node m 442 or mN 444, that was high on the last rising edge of the clock signal clk, high when the input data signal d changes when the clock signal clk is low. This prevents the sense nodes m 442 and 444 mN from leaking down and possibly causing the slave latch 406 to flip prematurely if the clock signal clk is stopped in the low state for a long period of time. If the low clock period can be bounded or if input transistors 412, 416 and 418 can be made leaky enough, the keeper circuit 408 can be omitted.

In one implementation, the keeper 408 uses low threshold voltage (LVT) p-channel field effect transistors (PFETs) 436 and 438 with gates tied to the high side potential (Vdd). The leaky LVT transistors 436 and 438 act like resistors to keep sense nodes m 442 and mN 444 from leaking low. The transistors 436 and 438 will keep sense nodes m 442 and mN 444 above the threshold voltage of NAND gates 432 and 434 as long as the leakage of the LVT PFETs 436 or 438 at the NAND gate threshold is greater than the leakage of the standard (SVT) or high (HVT) threshold voltage transistor 430 at threshold across process corners.

Figure 1:
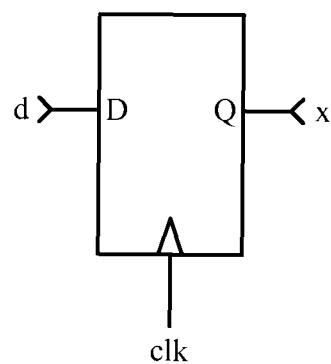
FIG. 1 shows a circuit symbol of an exemplary data flip-flop according to the conventional art.
Figure 3:
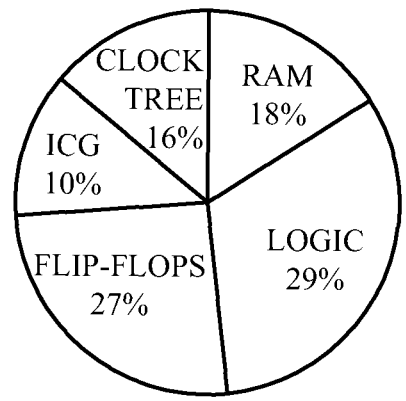
FIG. 3 shows a block diagram illustrates the dynamic energy consumed by an exemplary conventional electronic device.
Figure 2A:
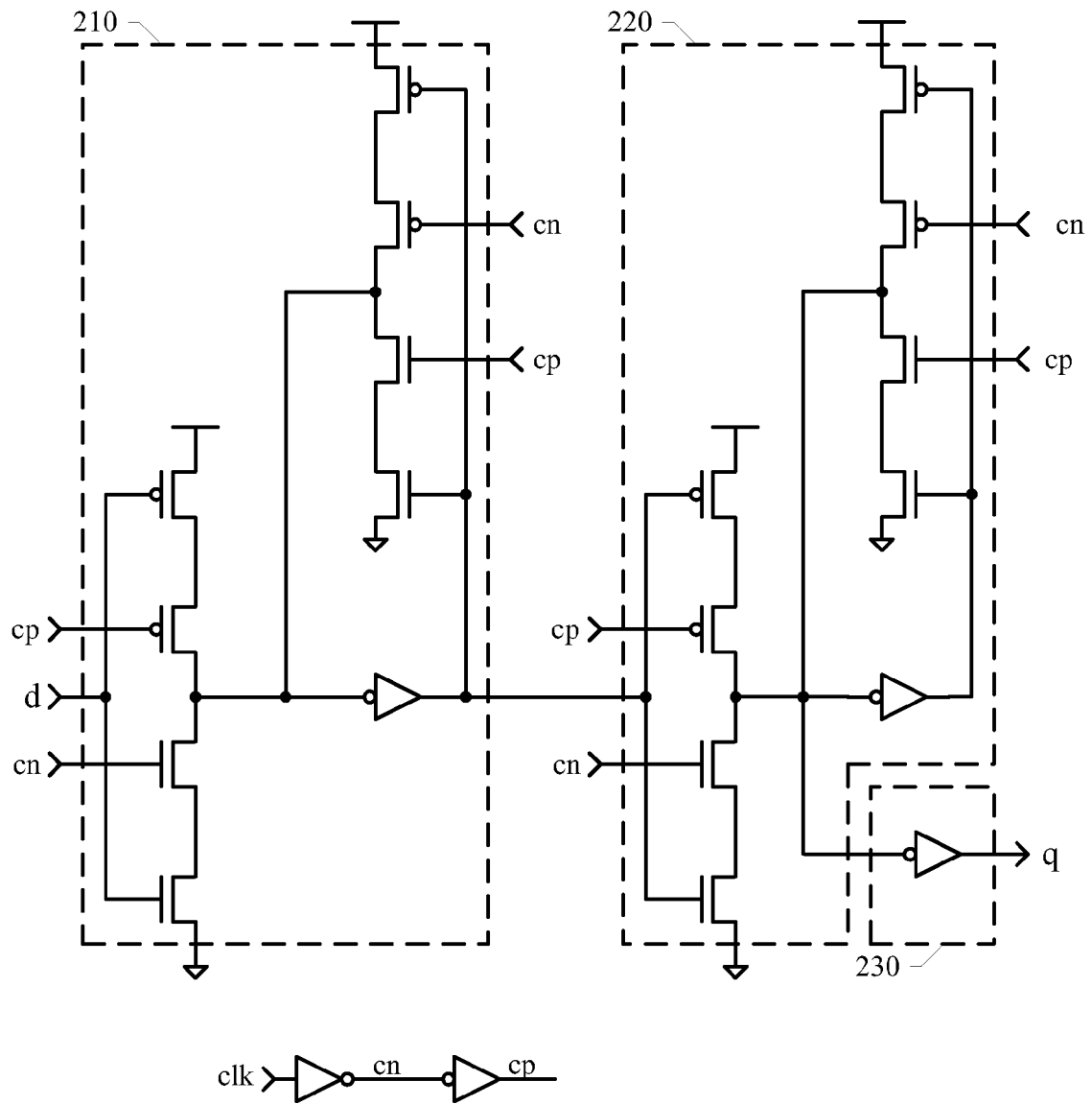
FIG. 2A shows a circuit diagram of an exemplary data flip-flop according to the conventional art.
Figure 2B:
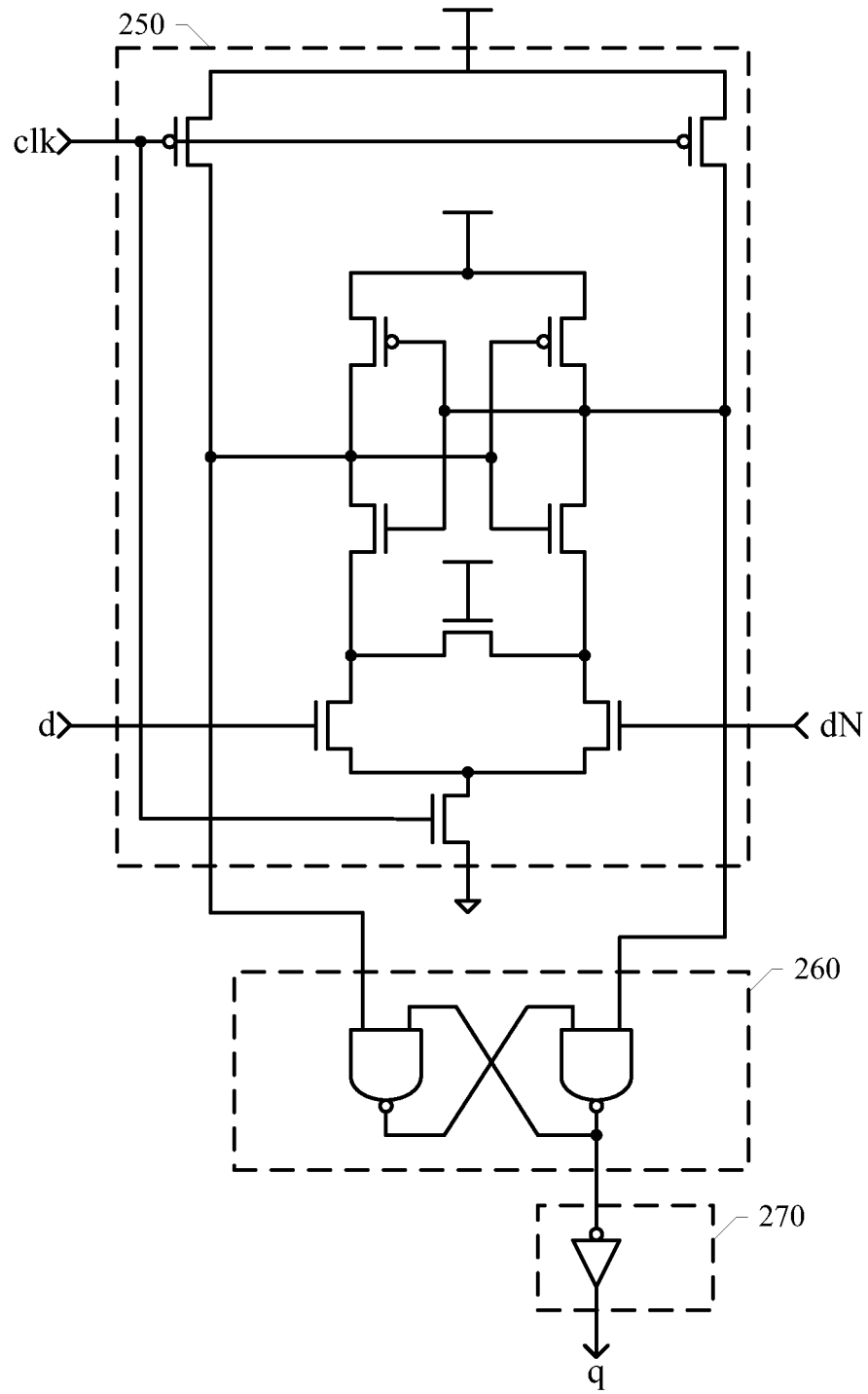
FIG. 2B shows a circuit diagram of another exemplary data flip-flop according to the conventional art.

The flip-flop 400 has two clock gate loads, which may be minimally-sized, and does not swing internal nodes during a clock cycle when the data remains stable. In comparison, the conventional flip-flop illustrated in FIG. 2B has three clock loads and half of the internal nodes toggle each clock cycle. The conventional flip-flop therefore has approximately eight to twelve equivalent gate loads. Therefore, the flip-flop 400 consumes one quarter to one sixth of the power consumed by the conventional flip-flop.

Figure 6:
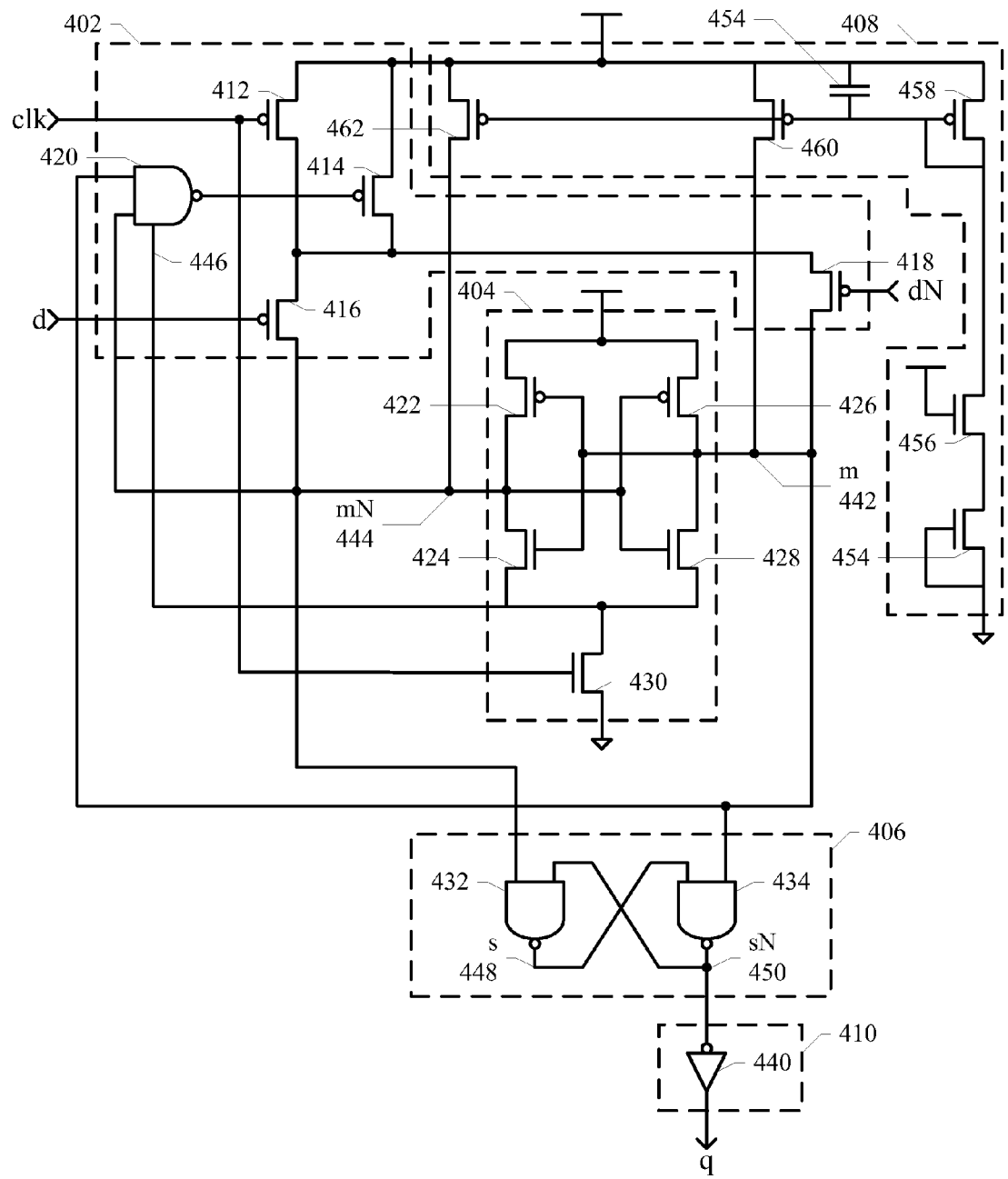
FIG. 6 shows a circuit diagram of a keeper, in accordance with another embodiment of the present technology.

Referring now to FIG. 6, another keeper sub-circuit, in accordance with a second embodiment of the present technology, is shown. The keeper circuit 408 uses a current mirror to avoid difficulties due to n-channel field effect transistor (NFET) and PFET mismatch. Transistor 454, a large, LVT NFET generates a leakage current that is guaranteed to be greater than the leakage current of the NFETs in the master storage element sense amplifier sub-circuit 404. This current is mirrored by PFETs 458-462 so that transistors 460 and 462 provide a keeper current that is guaranteed to be big enough to overcome the leakage of the NFETs in the master storage element sense amplifier sub-circuit 404.

While the current mirror keeper 408 avoids sensitivity to variations between different types of transistor devices, it may still be sensitive to variations between the same type of transistor device. In particular variations in threshold voltage between transistor 418 or transistor 422 and transistor 416 will cause the keeper current to vary. Variations in leakage between transistor 412 and one or more of transistors 426, 428 and 430 need to be accounted for by adding margin.

Figure 7:
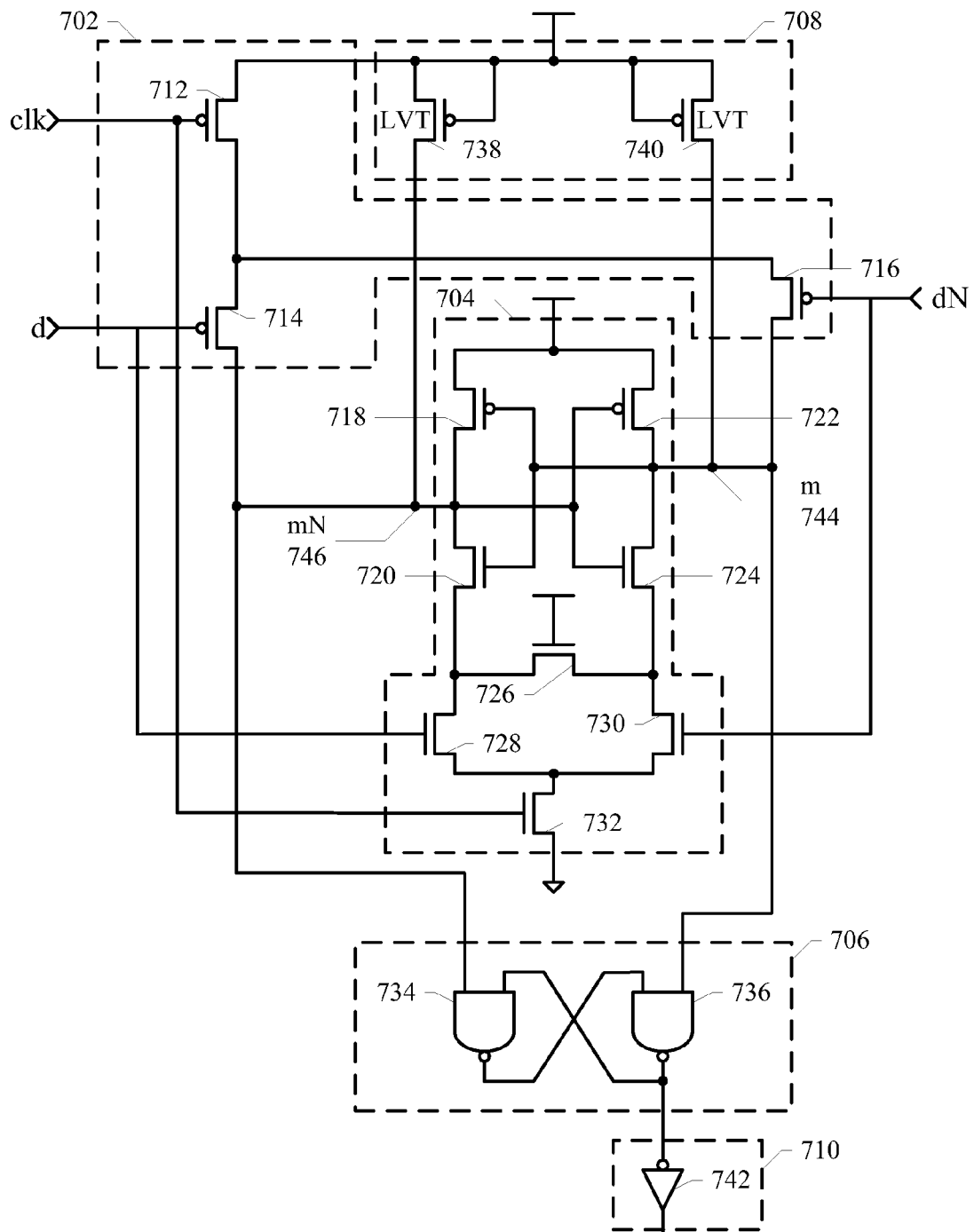
FIG. 7 shows a circuit diagram of a flip-flop including input-gated pre-charge (IGP), in accordance with another embodiment of the present technology.

Referring now to FIG. 7, a flip-flop circuit including input-gated pre-charge (IGP), in accordance with another embodiment of the present technology, is shown. The input 702 includes transistors 712-716. The master storage element sense amplifier sub-circuit 704 may include transistors 718-732. The master storage element sense amplifier sub-circuit 704 is commonly referred to as a StrongARM sensing stage. The slave latch 706 may include NAND gates 734 and 736. The keeper 708 may include transistors 738 and 740 to hold the active sense nodes m 744 and mN 746 high when the clock is low. The output isolation 710 may include inverter 742.

Gating the pre-charge eliminates much of the power dissipation of the StrongARM sensing stage 704 by pre-charging a sense node m 744 or mN 746 only when the input data signal d changes. When the input data signal 3 remains unchanged, the sense nodes m 744 and mN 746 hold their previous state. When the clock signal clk is low, and input data signal d is low, sense node mN 746 is pre-charged. However, the sense node mN 746 will already be high unless the input signal d changed since the last rising edge of the clock signal d. Similarly, if the clock signal clk is low and the input data signal d is high (dN low) sense node m 744 is pre-charged, but will already be high unless the input signal d has changed. Thus, like the circuit of FIG. 4, this circuit achieves very low clock energy by avoiding toggling nodes unless the input data signal d changes state.

When the clock signal clk rises, if the input data signal d has not changed since the last clock edge, nothing happens. Consider the case where the input data signal d is high. Sense node m 744 is already high and sense node mN 746 is already low. When the clock signal clk rises, sense node mN 746 is pulled low through transistors 718, 728 and 732, but since it's already low, no energy is dissipated. Sense node m 744 is held high via transistor 722. When the clock signal clk rises and the input data signal d has changed since the last clock edge, both sense nodes m 744 and mN 746 will be initially high and the master storage element sense amplifier 704 acts as a normal StrongARM sensing stage. Transistors 728 and 730 of the master storage element sense amplifier sub-circuit 704 steer the current to pull down the source of transistor 720 (d high) or 724 (d low). Once the selected source node is pulled down through a threshold voltage, the corresponding sense node m 744 or mN 746 is pulled low and the cross-coupled inverter transistors 718-724 regenerate. In the case where input signal d is high, sense node mN 746 is pulled low via transistors 720, 728 and 732. Regeneration pulls sense node m 744 high via transistor 722. Once sense node mN 746 falls, transistor 724 turns off, preventing sense node m 744 from being pulled down if the input data signal d changes. Transistor 726 also turns on to provide current to transistor 720 in the event that the input data signal d changes to prevent sense node mN 746 from leaking upward. These two events make the master storage element sense amplifier sub-circuit 704 insensitive to the input data signal d changing after the sensing decision has been made.

Once one side of the master storage element sense amplifier sub-circuit 704 has been pulled low, the slave latch 706 repeats this state and will hold it until the next rising edge of the clock signal clk. When the clock signal clk falls, keeper transistors 738 and 740 hold the sense node m 744 or mN 746 corresponding to the current state of the flip-flop high to prevent prematurely flipping the slave latch 706 when the input data signal d changes and the clock signal clk is low for a long period of time.

When sense nodes m 744 or mN 746 drift to an intermediate voltage, there will be no current drawn in the NAND gates 734 and 736 of the slave latch 706 since if one of the sense nodes m 744 or mN 746 is drifting upward, the other input of the slave latch 706 be low.

The flip-flops of FIGS. 4 and 7 differ primarily in how input drive is applied. The flip-flop with IPG of FIG. 4 provides drive to the sense nodes through the pre-charge network of transistors 412-418 and uses NAND gate 420 to detect completion of sensing and remove this drive. The flip-flop with IGP of FIG. 7 uses current steering through transistors 728 and 730 of the StrongARM sensing stage 704 to drive the sense nodes and uses the turn-on of transistor 726, effectively shorting the sources of transistors 720 and 724, to remove the drive.

Applying input-gated pre-charge to the sense amplifier of a StrongARM flip-flop and extending the input drive with a completion detector improve the efficiency of the flip-flop.

A complementary version of the flip-flops of FIGS. 4 and 7 can be realized by replacing PFETs with NFETs, NFETs with PFETs, and NANDs with NORs. The resulting complementary flip flops will be falling-edge sensitive flops that gate pre-discharge with the input data signal when the clock is high and then drive a master storage element sense amplifier when the clock falls. A cross-coupled NOR slave latch captures the sensed value when one of the sense nodes goes high.

Figure 8:
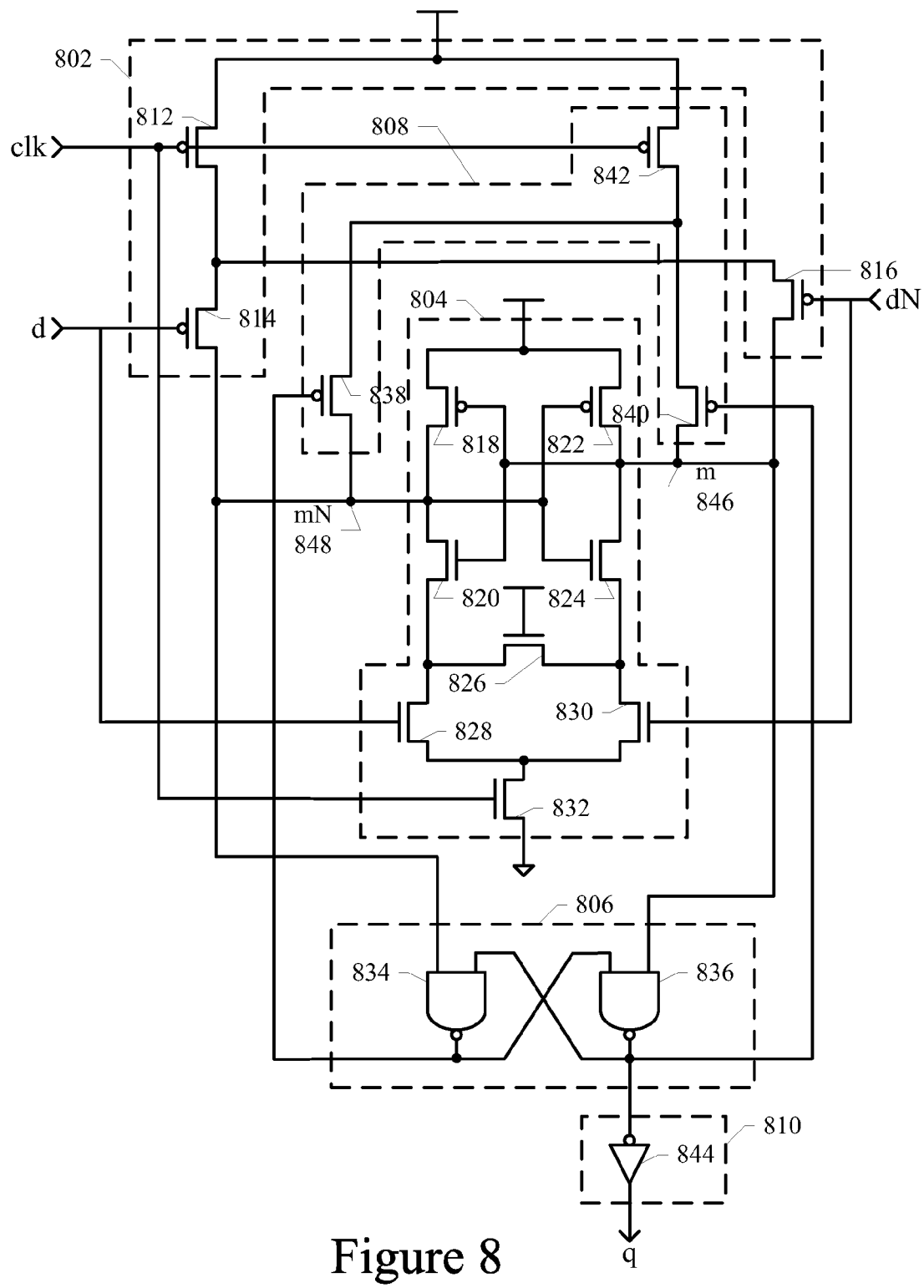
FIG. 8 shows a circuit diagram of a flip-flop including input-gated pre-charge (IGP), in accordance with another embodiment of the present technology.

Referring now to FIG. 8, a flip-flop circuit including input-gated pre-charge (IGP), in accordance with another embodiment of the present technology, is shown. The input 802 includes transistors 812-816. The master storage element sense amplifier sub-circuit 804 may include transistors 818-832. The master storage element sense amplifier sub-circuit 804 is commonly referred to as a StrongARM sensing stage. The slave latch 806 may include NAND gates 834 and 836. The keeper 808 may include transistors 838-842 to hold the active sense nodes m 846 and mN 848 high when the clock is low. The output isolation 810 may include inverter 844. The flip flop uses feedback transistors 838 and 840 to keep the selected sense node m 846 or mN 848 high rather than LVT keeper transistors. The flip-flop is not sensitive to variability of leakage current, but includes one additional clock load. The feedback keeper transistors 838 and 840 also capacitively unbalance the sense nodes m 846 and mN 848, adding more capacitance to the side that was high on the last clock edge. If problematic, this capacitive imbalance can be cancelled with keeper compensation as described below with regard to FIGS. 10-13.

Figure 9:
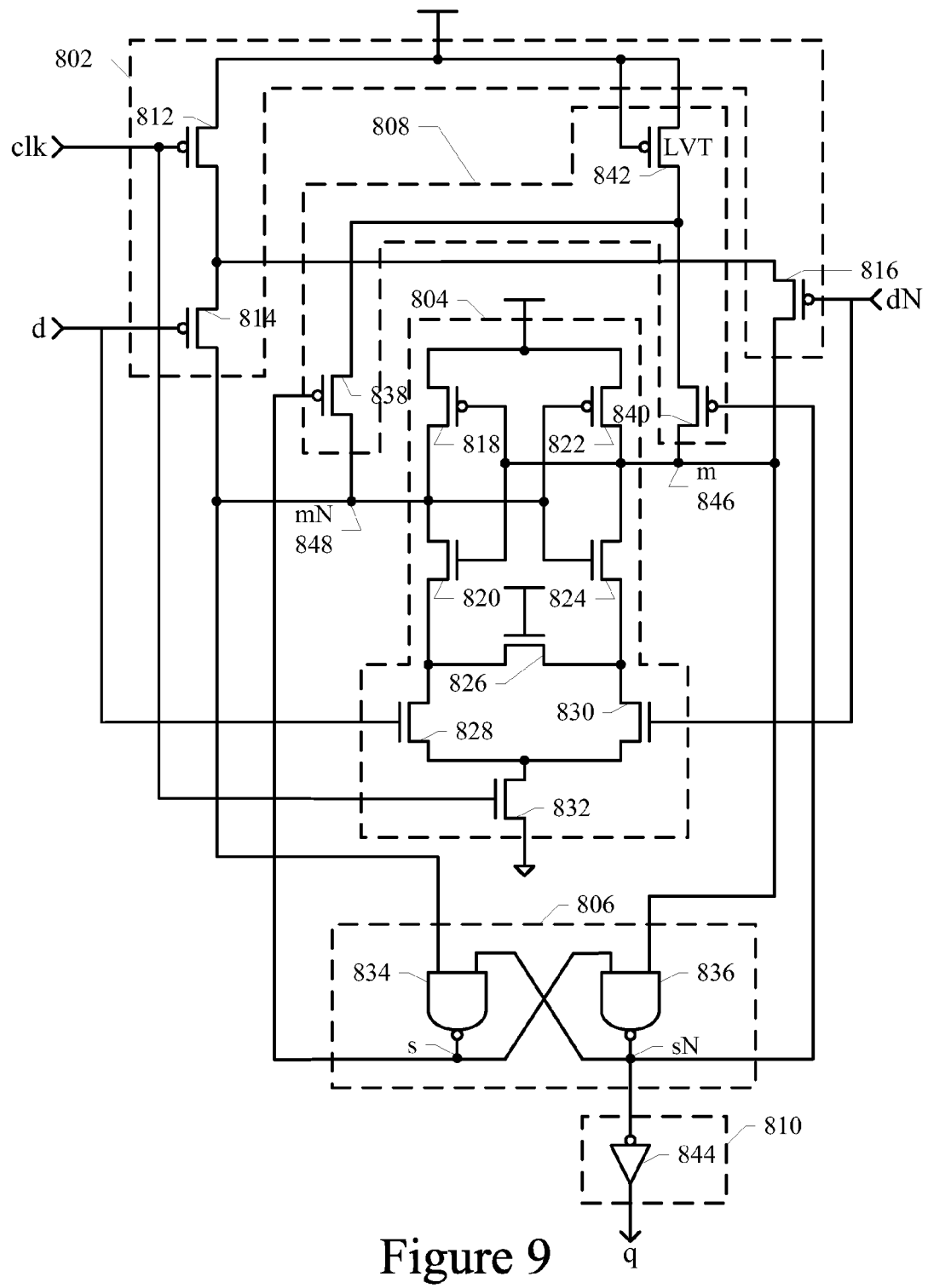
FIG. 9 shows a circuit diagram of a flip-flop including input-gated pre-charge (IGP), in accordance with another embodiment of the present technology.

A third version of the IGP StrongARM that uses feedback to steer an LVT transistor 842 of the keeper 808 is shown in FIG. 9. Compared to the circuit of FIG. 7, this circuit has the advantage that the LVT transistor 842 of the keeper 808 is never sourcing current into a node that is being statically pulled down. When the clock signal clk is high and sense node mN 848 is low, transistor 838 in FIG. 7 is sourcing current into sense node mN 848 which is being actively pulled down. With the circuit of FIG. 9, transistors 838 and 840 steer the current from the single LVT transistor 842 of the keeper 808 so current is sourced only into the sense node corresponding to the currently high output (i.e., m if s=1).

With this approach the keeper 808 restores charge that leaks off of transistor 832 when the clock signal is low (clk=0). The feedback steering LVT keeper advantageously reduces static power to that of a conventional StrongARM flip-flop. The feedback steering LVT keeper also advantageously reduces the constraints on the current sourced by the LVT transistor 842. The keeper needs to be sized and biased to generate more current than transistor 832 leaks in the highest case (order of 10 nA) and less current than transistors 832, 828 and 820 in series sink when on in the lowest case (order of 100 uA). Because increasing the LVT current does not increase static power, it can be sized generously in the center of this range making this circuit very tolerant of device variation.

Figure 10:
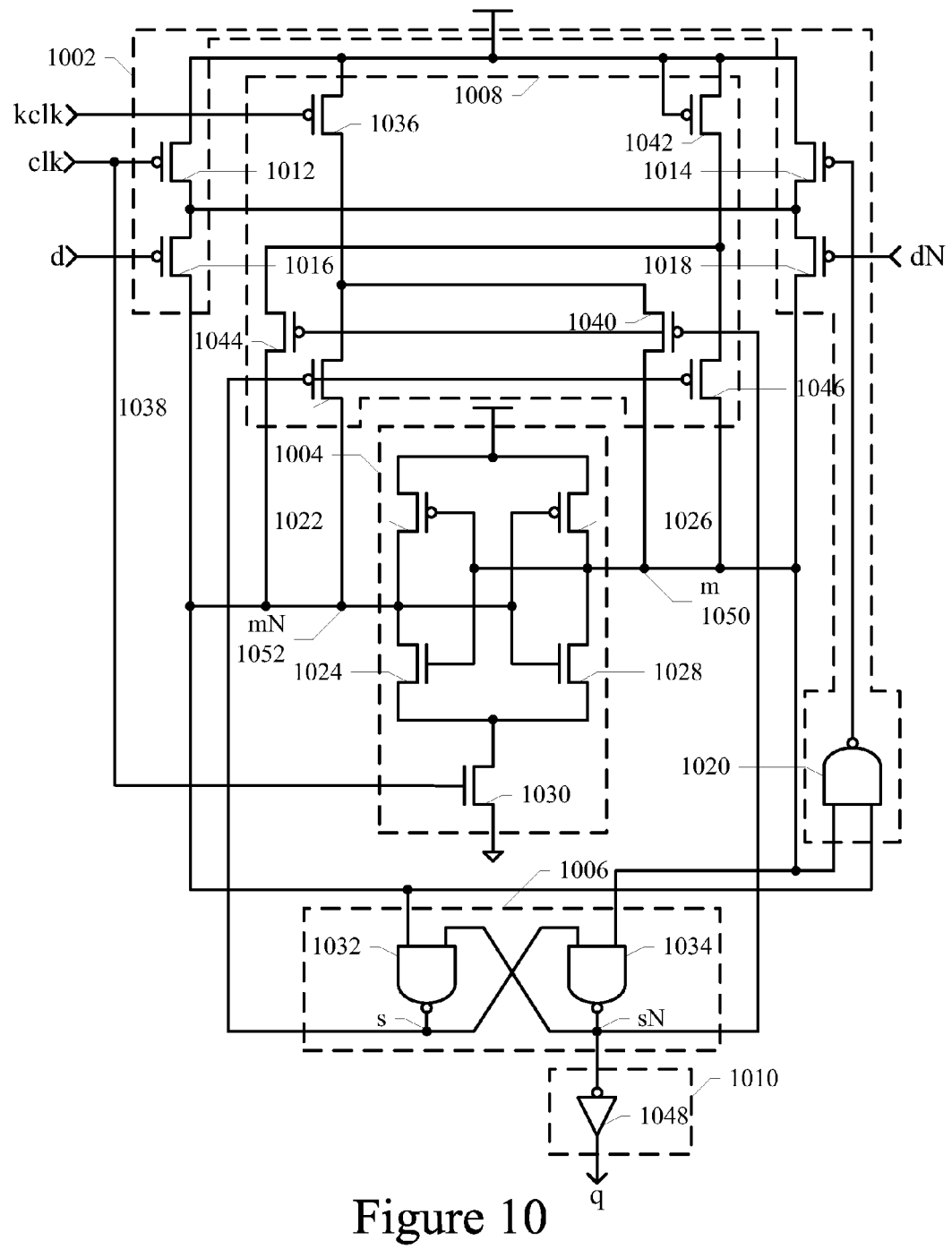
FIG. 10 shows a circuit diagram of a flip-flop including input-gated pre-charge (IGP), in accordance with another embodiment of the present technology.

Referring now to FIG. 10, a flip-flop circuit including input-gated pre-charge (IGP) and clocked feedback keeper, in accordance with one embodiment of the present technology, is shown. The flip-flop includes an input sub-circuit 1002, a master storage element sense amplifier sub-circuit 1004, a slave latch sub-circuit 1006, a clocked feedback keeper sub-circuit 1008, and optionally an output isolation sub-circuit 1010. The input 1002 may include transistors 1012-1018 and NAND gate 1020. The master storage element sense amplifier 1004 may include transistors 1022-1030. The slave latch 1006 may include NAND gates 1032 and 1034. The clocked feedback keeper 1008 may include transistors 1036-1046 to hold the active sense nodes m 1050 and mN 1052 high when the clock is low. The output isolation 1010 may include inverter 1048.

The clocked feedback keeper 1008 includes a capacitance compensation circuit 1042-1066 to balance the capacitance of the keeper circuit on sense node m 1050 and mN 1052. The transistors 1036-1040 of the clocked feedback keeper 1008 acts to pull up the sense node corresponding to the current state of the salve latch 1006 whenever the keeper clock signal kclk is low. For example, if the slave latch is in the high state (s=1, sN=0), sense node m 1050 is pulled high via transistors 1040 and 1036 whenever keeper clock signal kclk is low. Similarly, if the slave latch 1006 is in the low state, sense node mN 1052 is pulled high via transistors 1038 and 1036.

The keeper clock signal kclk can be tied to the clock signal clk for simplicity, but doing so results in three clock loads rather than the two clock loads of flip-flop in FIG. 4. Because the clocked feedback keeper 1008 operates to restore a small amount of charge that leaks off of the sense nodes 1050 and 1052, it is not necessary to activate the keeper clock signal kclk every cycle. It is sufficient for the keeper clock signal kclk to go low once every N cycles, where N is small enough so that charge is restored before a sense node 1050 or 1052 leaks below the NAND gate threshold. A value, N of 100, would suffice for most conditions and would result in the keeper clock load consuming only 1% of the energy of a clock load that toggled every cycle. The keeper clock signal kclk should be gated high enough in the clock tree so that the clock load of the OR gate used to create the keeper clock signal kclk can be amortized over many flip-flops.

If transistors 1034-1038 of the clocked feedback keeper 1008 is used by themselves, its switched capacitance unbalances the sense nodes m 1050 and mN 1052 in a manner that introduces hysteresis. For example, if the slave latch 1006 is high (sN=0) and transistor 1038 is on adding the source capacitance of transistors 1038 and 1036, and the drain capacitance of transistor 1034 to sense node m 1050 during sensing. This added capacitance on sense node m 1050 compared to sense node mN 1052 slows the fall of sense node m 1050 and generates the equivalent of an offset voltage with a magnitude of $C/g_m$. In this case the offset voltage switches polarity depending on the state of the slave latch 1006.

To eliminate the offset voltage due to the capacitive loading of the clocked feedback keeper 1008, the capacitance compensating transistors 1040-1044 are added. Transistors 1040-1044 implement a dummy keeper network that adds an equivalent capacitance to the opposite sense node 1050 or 1052 to balance the master storage element sense amplifier sub-circuit 1004. For example, if the slave latch 1006 is in the high state (s=1, sN=0) so that transistor 1038 is on adding capacitance to sense node m 150, then transistor 1042 will also be on to add an equivalent amount of capacitance to sense node mN 1052. Care must be taken in layout to make sure the capacitance of the keeper network and the compensating network are matched as closely as possible.

Figure 11:
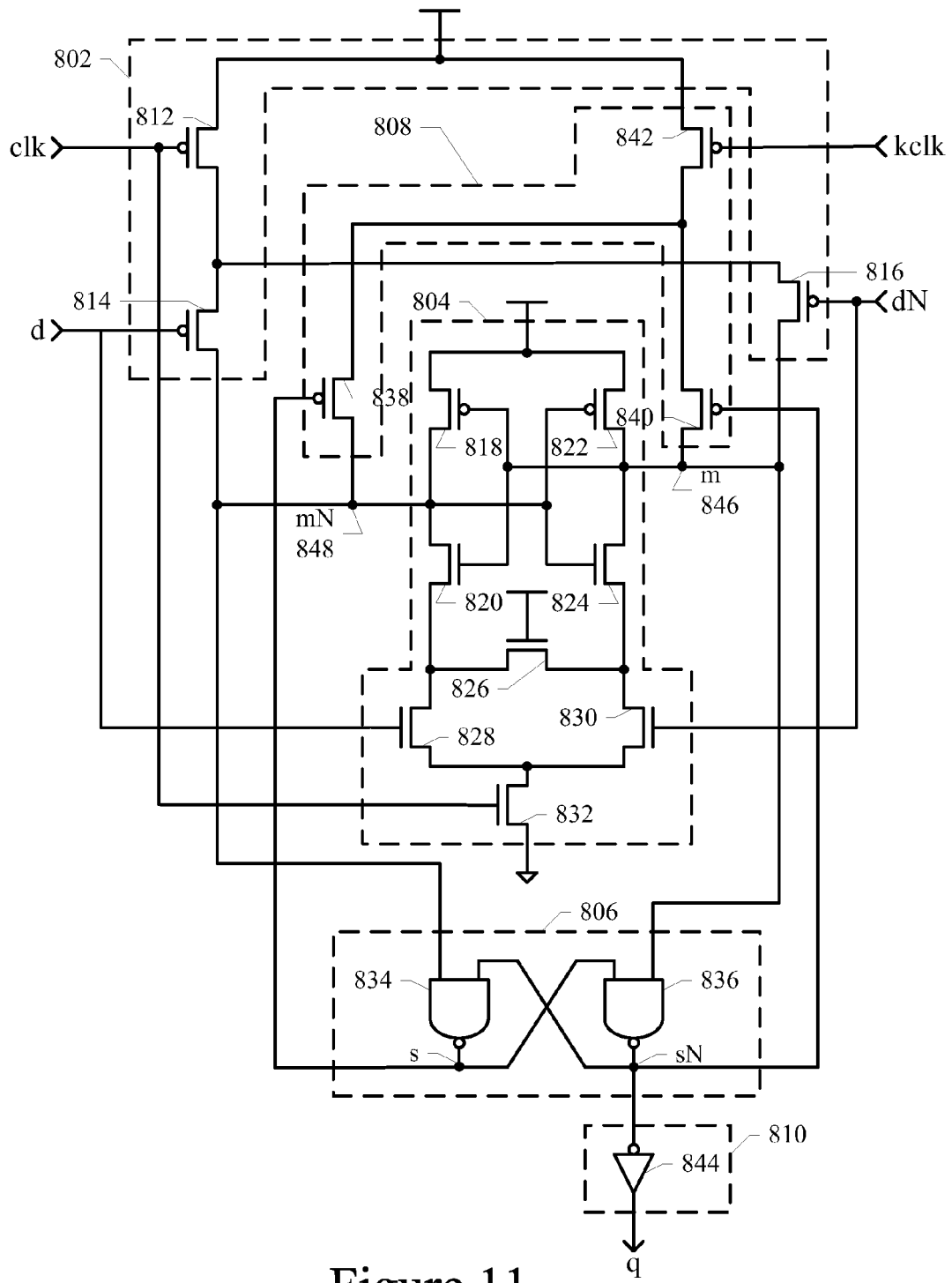
FIG. 11 shows a circuit diagram of a flip-flop including input-gated pre-charge (IGP), in accordance with another embodiment of the present technology.

Referring now to FIG. 11, a flip-flop circuit including input-gated pre-charge (IGP) and clocked feedback keeper, in accordance with another embodiment of the present technology, is shown. The flip-flop includes a low-frequency keeper clock added to the strongARM flip-flop core with feedback keeper of FIG. 9. The keeper compensation network can be applied to balance the capacitance of the sense nodes. However, the StrongARM flip-flop core is less sensitive to capacitive imbalance so compensation may not be needed.

Figure 12:
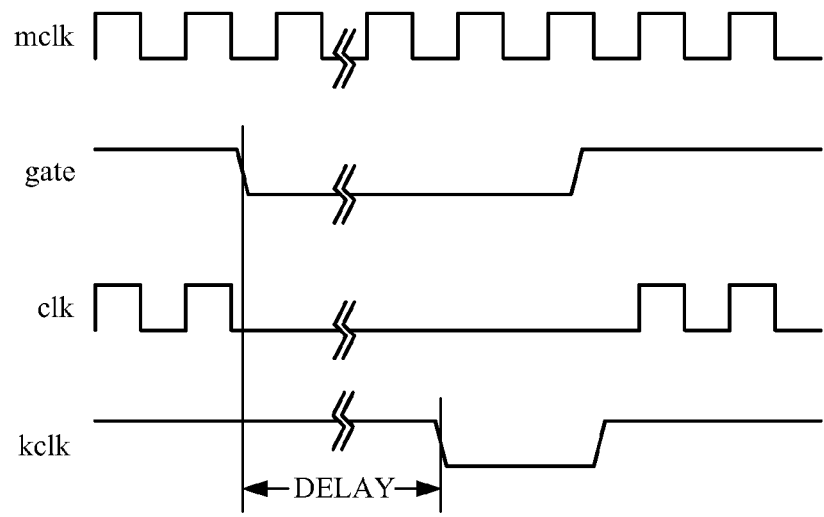
FIG. 12 shows exemplary waveforms illustrating generation of a keeper clock signal, in accordance with one embodiment of the present technology.

Referring now to FIG. 12, waveforms illustrating generation of a keeper clock signal kclk, in accordance with one embodiment of the present technology, is shown. As illustrated, the keeper clock signal kclk can be generated from a clock gating signal. With this approach the keeper clock signal kclk goes low only when the clock signal clk has been gated low for a delay time long enough for sense node m or mN to start leaking low (about 100 ns). After going low, the keeper clock signal kclk stays low until the clock gating signal goes high. This approach takes advantage of the fact that clock signal clk high intervals restore both sense nodes m and mN to full levels. Hence the keeper clock signal kclk is needed only when the clock signal clk low interval becomes too long. To reduce power, the delay can be implemented by delaying the gate signal using flip-flops driven by a low-frequency clock (e.g., 25 ns period).

Figure 13:
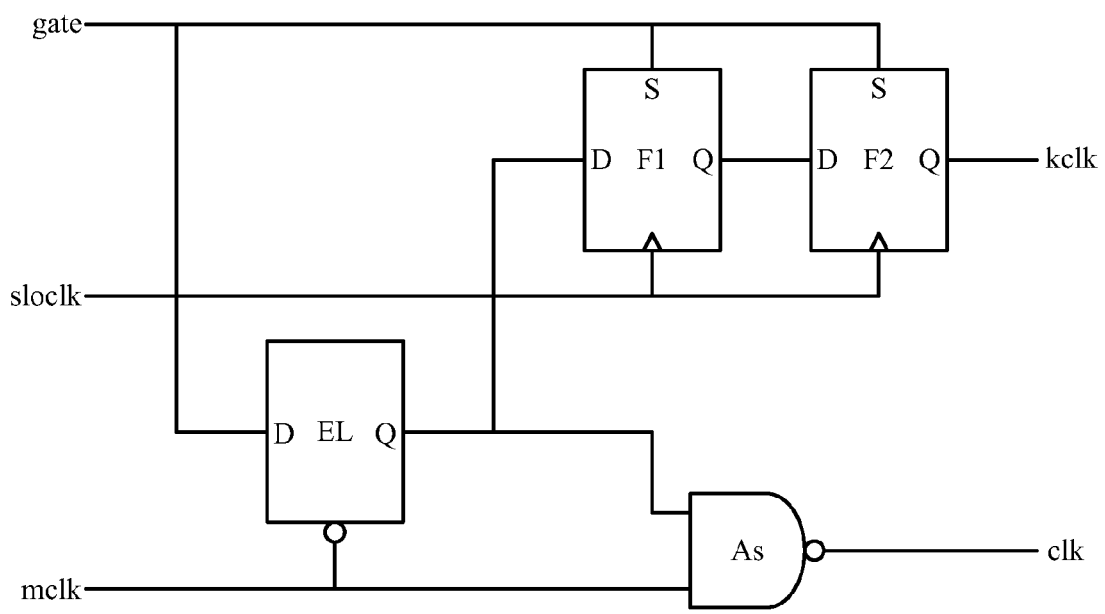
FIG. 13 shows a circuit diagram of a keeper clock, in accordance with another embodiment of the present technology.

Referring now to FIG. 13, a keeper clock circuit, in accordance with another embodiment of the present technology, is shown. The keeper clock circuit may include a low energy latch (EL) 1305, an asymmetric NAND gate (As) 1310, a pair of flip-flops asynchronous sets (F1, F2) 1315, 1320 clock by a slow clock signal sloclk with a period equal to about half of the maximum delay. The pair of asynchronous set flop-flops 1315, 1320 delay the synchronous gate signal by one to two periods of the slow clock signal sloclk to cause the keep clock signal kclk to fall. The asynchronous set returns the keep clock signal kclk high as the gate signal goes high. The keep clock signal can be generated with a relatively low amount of energy as compared to a conventional clock gating circuit including a low energy latch and an asymmetric NAND gate.

Figure 14:
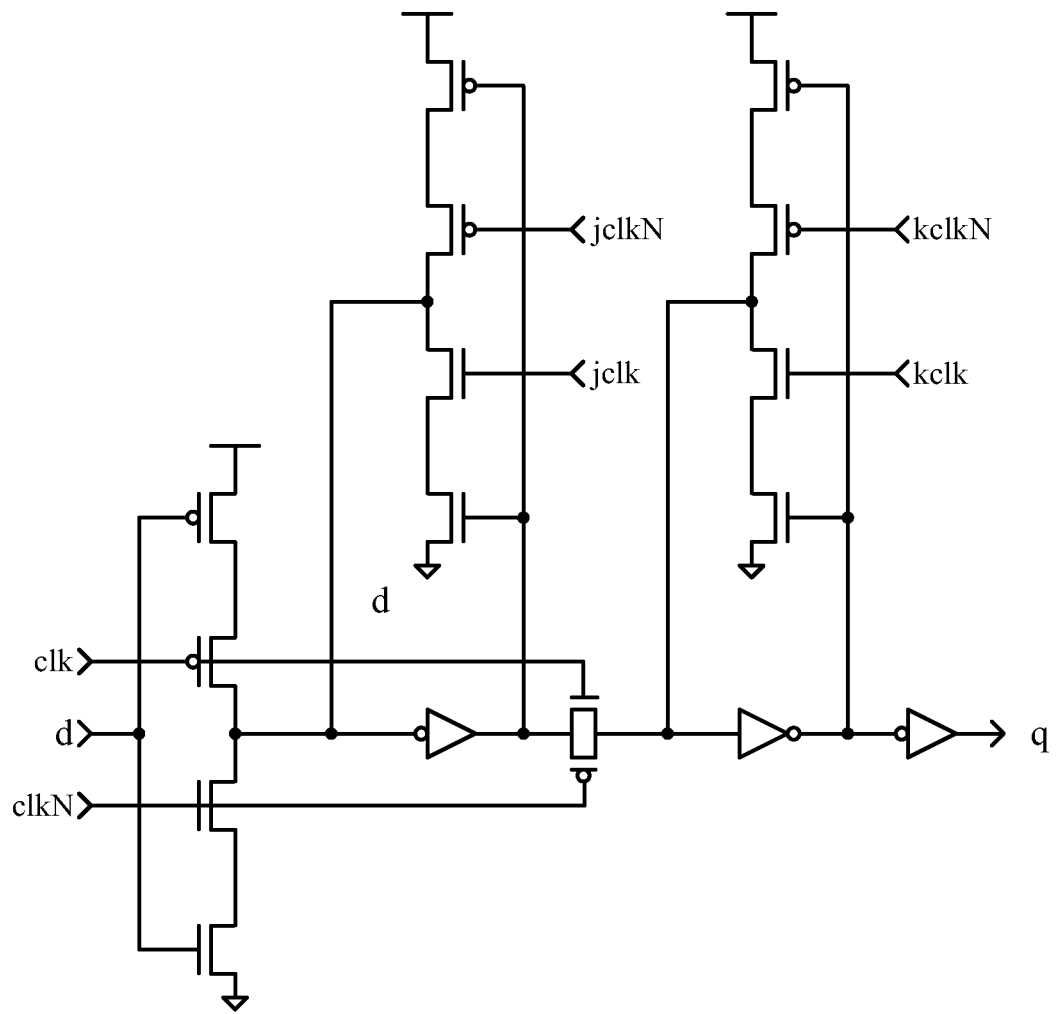
FIG. 14 shows a circuit diagram of a flip-flop including a low frequency keeper clock, in accordance with another embodiment of the present technology.

Referring now to FIG. 14, a flip-flop circuit including a low frequency keeper clock, in accordance with another embodiment of the present technology, is shown. The low-frequency keeper clocks can be used to reduce the clock energy of a conventional master-slave flip-flop. Not counting clock buffering and inverting, the clock load is reduced from 8 to 4 by using separate low-frequency keeper clock signals kclk and jclk to drive the keepers including transistors 1445-1480 of the backward facing tri-state inverters that are used to make transistors 1405-1420, inverter 1425-1435 and 1440 of the master and slave latches static when they are not sampling their input.

The keeper clocks, in the case of two separate clock jclk and kclk and their compliments are utilized, may be described by the equations:

$$jclk = clk \,\&\, one\_in\_n$$

$$kclk = clkN \,\&\, one\_in\_n$$

That is, keeper clock signal jclk is high when clk is high and when signal "one_in_n," which is high one cycle out of every N cycles, is high. Keeper clock signal kclk is high when clk is low and "one_in_n" is true. The versions of "one_in_n" used by the two AND gates must be retimed as appropriate so they are stable during clock high and clock low respectively.

The generation of keeper clock signals jclk and kclk should take place high enough in the clock tree to amortize the cost of the clock gating over many flip-flops.

Figure 15:
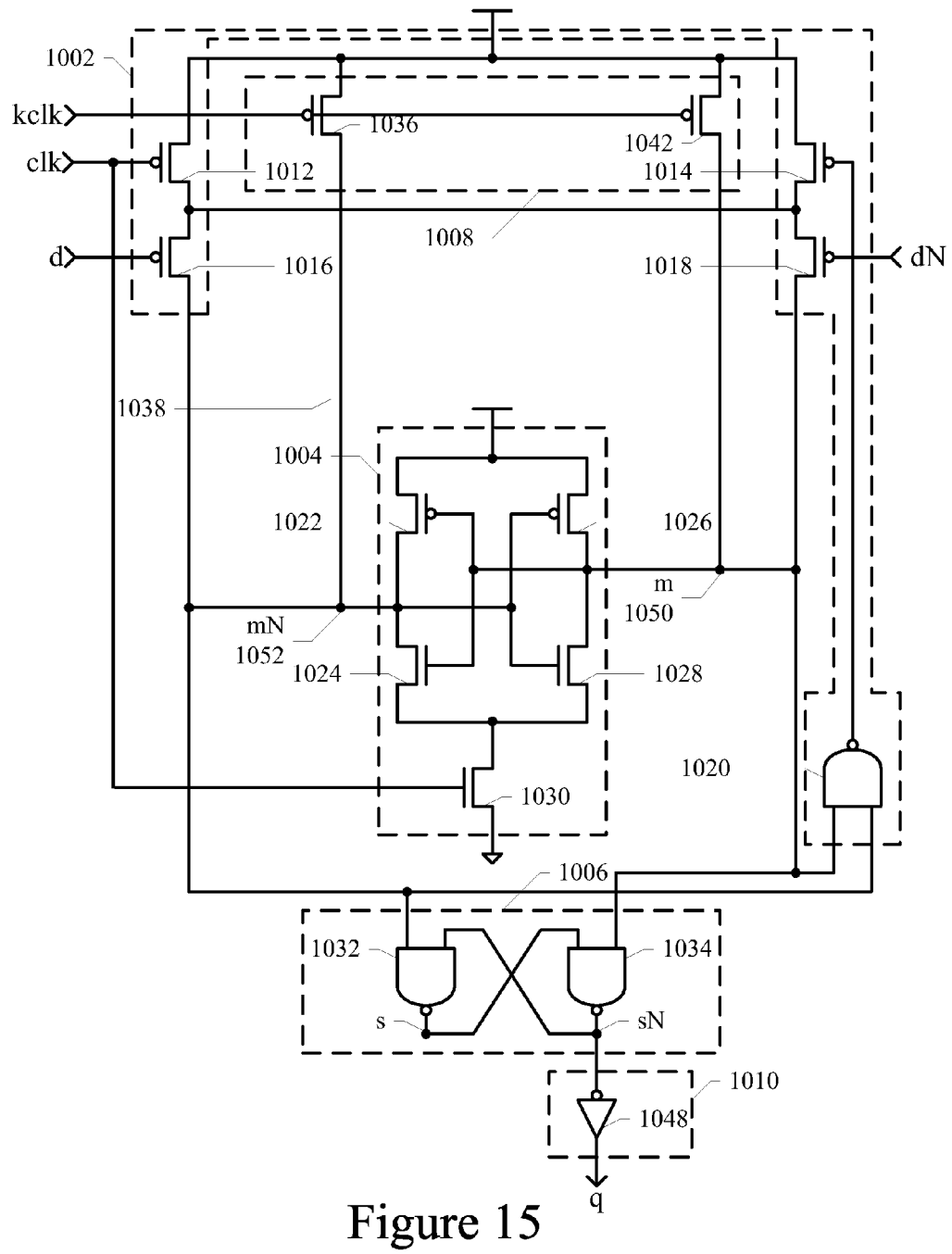
FIG. 15 shows a circuit diagram of a flip-flop including a low frequency keeper clock, in accordance with another embodiment of the present technology.

Referring now to FIG. 15, a flip-flop circuit including a low frequency keeper clock, in accordance with another embodiment of the present technology, is shown. The complexity of the low-frequency keeper of FIG. 10 can be significantly reduced with a small increase in power dissipation by pre-charging both sense nodes m and mN on each pulse of keeper clock kclk as shown in FIG. 15. This un-gated low-frequency pre-charge can also be applied to the input-gated StrongARM flip-flop of FIG. 7.

Figure 16:
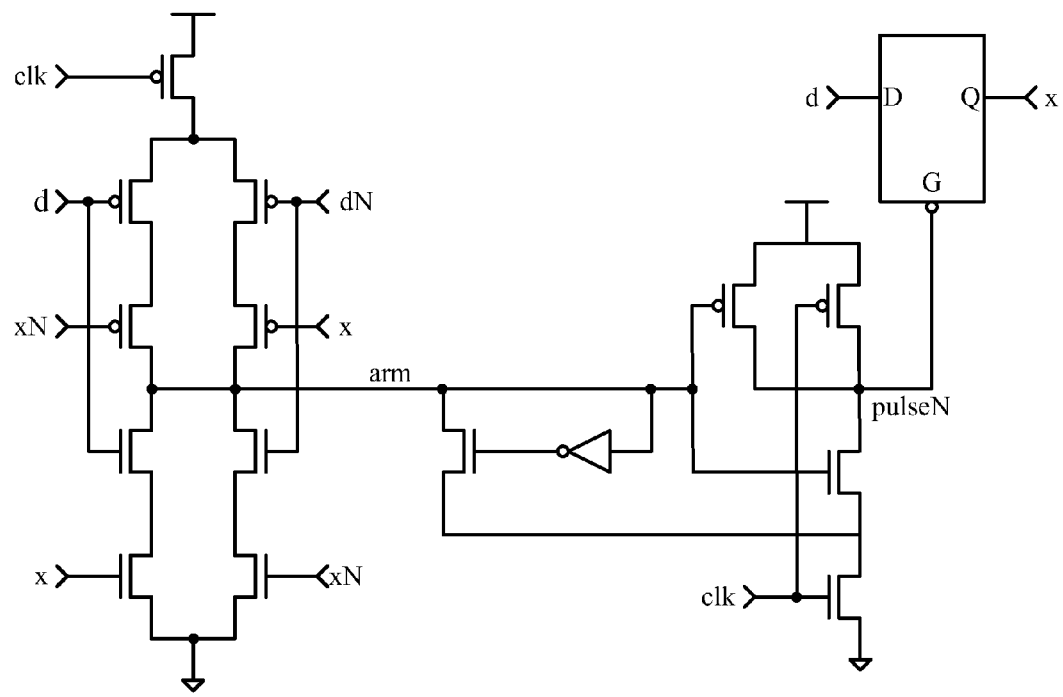
FIG. 16 shows a circuit diagram of an input-gated pulse latch, in accordance with one embodiment of the present technology.

Referring now to FIG. 16, an input-gated pulse latch flip-flop circuit, in accordance with one embodiment of the present technology, is shown. As illustrated, the input-gated pre-charge concept can be used to build a pulsed latch. The circuit uses input-gated pre-charge to arm the pulser by pulling the node labeled "arm" high when the clock is low and the latch input and output differ. Once the pulser is armed, the next rising edge of the clock enables the latch by driving signal "pulseN" low. When the latch output has been updated, d=x, causing signal arm to be pulled low, ending the low-going pulse. A keeper (inverter and NFET) holds "arm" low if the input changes while the clock is high. The circuit has a long hold time requirement. After the rising edge of the clock, the input must be held until the output "x" changes, node "arm" rises, and node "pulseN" falls. Any latch circuit can be used in the circuit including a conventional CMOS latch or a flip-flop circuit including input-gated pre-charge (IGP) as described herein.

Figure 17:
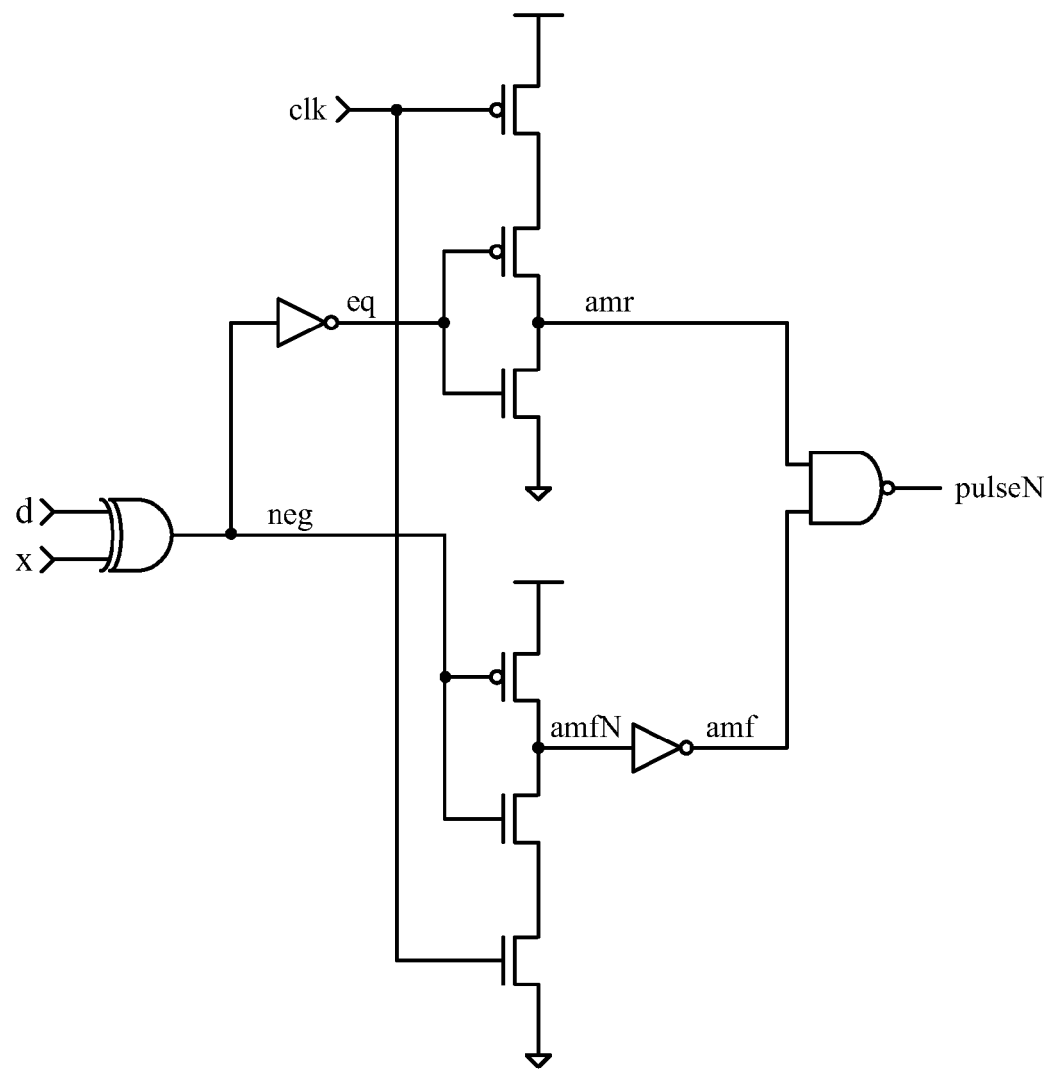
FIG. 17 shows a circuit diagram of a dual edge-triggered flip-flop, in accordance with one embodiment of the present technology.

Referring now to FIG. 17, a dual edge-triggered flip-flop circuit, in accordance with one embodiment of the present technology, is shown. The pulsed latch of FIG. 6 can be extended to act as a double-edge-triggered flip-flop (DETFF) by modifying the pulser to generate pulses on either edge of the clock. If input "d" changes while clk is low, "eq" goes low pulling up "armr" (arm for rising edge). On the rising edge of the clock, "armf" will go high causing pulseN to fall. When the output is updated "neq" goes false pulling both "armr" and "armf" low. Similarly, if the input changes while the clock is high, "neq" is asserted pulling down "armfN" which causes "armf" (arm for falling edge) to go high. When the clk falls, "armr" rises causing the pulse.

The dual edge-triggered flip-flop circuit needs keepers (not shown) to hold node "armfN" low when the input changes while "clk" is low and to hold "armr" high if the input changes while "clk" is high. In addition to the larger hold time which this circuit shares with the circuit of FIG. 6, the circuit also needs a clock with a carefully controlled duty factor.

Figure 18:
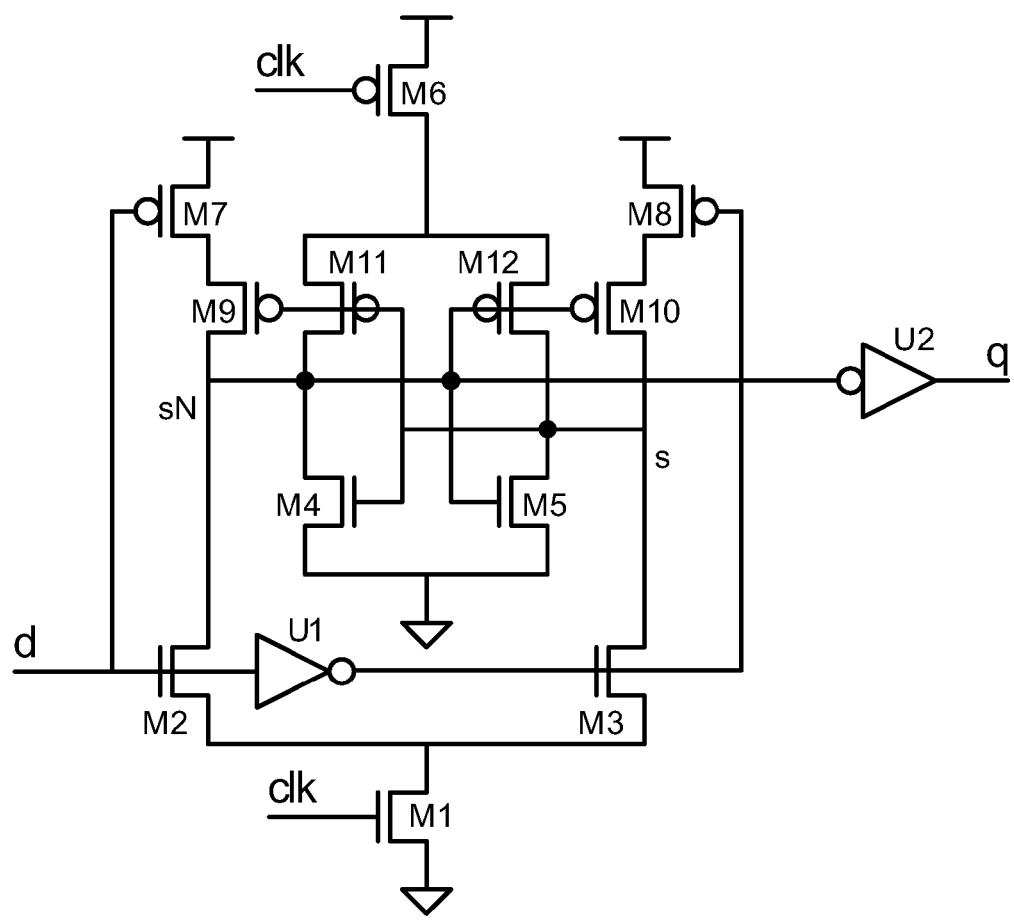
FIG. 18 shows a circuit diagram of a low energy latch, in accordance with another embodiment of the present technology.

Referring not to FIG. 18 a low energy latch circuit, in accordance with another embodiment of the present technology. The low-energy latch is characterized by two clock loads and is static when the clock signal is not changing states.

Embodiments of the present technology advantageously include flip-flops, latches and the like with reduced power consumption. The clocked gates and switch nodes are substantially reduced compared to conventional flip-flops, latches and the like without substantially increasing the transistor count of the circuits. Embodiments of the present technology may implement various combinations of the input-gated precharge, keeper circuits, keeper circuit capacitance compensation, and/or state switching completion sensing.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A device comprising:
    a clocked flip-flop core;
    an input-gated pre-charge circuit to charge a sense node of the clocked flip-flop core when an input data signal changes states and to stop driving the sense node when switching of a state of a master storage element of the clocked flip-flop core is completed; and
    a keeper circuit to maintain the state of the sense node of the clocked flip-flop core when a clock signal is held in a given state.

2. The device of claim 1, wherein the clocked flip-flop core comprises a cross-coupled inverting element including a differential sense node, and a clock input.

3. The device of claim 1, wherein the clocked flip-flop core comprises the master storage element sense amplifier and a slave latch coupled to the master storage element sense amplifier.

4. The device of claim 3, wherein the clocked flip-flop core further comprises an output isolation circuit coupled to the slave latch.

5. The device of claim 1, wherein the keeper circuit restores charge to the sense node of the clocked flip-flop core once every predetermined number of cycles of the clock signal.

6. The device of claim 1, wherein the keeper circuit restores charge to the sense node, to maintain the state of the sense node of the clocked flip-flop core, wherein the charge is restored off a clocked gating signal of the input-gated pre-charge circuit.

7. The device of claim 1, wherein the keeper circuit includes a capacitance compensation circuit coupled to the sense node of the clocked flip-flop core.

8. A device comprising a plurality of flip-flop circuits, wherein one or more flip-flop circuits each include:
    a flip-flop core including a first input to receive a clock signal, a second input to receive a data signal and an output to produce an output signal;
    an input-gated pre-charge circuit to charge a given sense node of the flip-flop core when the input data signal changes state and to stop driving the given sense node when switching of a state of the flip-flop core is completed.

9. The device of claim 8, wherein each of the one or more flip-flop circuits further include a keeper circuit to maintain a state of one of the sense nodes of the flip-flop core.

10. The device of claim 9, wherein each keeper circuit comprises a leaky transistor coupled between the one of the sense nodes of the flip-flop core and a supply potential.

11. The device of claim 9, wherein each keeper circuit restores charge to the differential input of the flip-flop once every predetermined number of cycles of the clock signal.

12. The device of claim 9, wherein each keeper circuit includes a capacitance compensation circuit coupled to another one of the sense nodes of the clocked flip-flop.

13. The device of claim 8, wherein each flip-flop core comprises a master storage element sense amplifier including differential sense nodes, wherein a supply potential of the master storage element sense amplifier is gated by the clock signal.

14. A device comprising:
    a means for gating pre-charging of a sense node of a master storage element when an input data signal changes and a clock signal is in a given state;
    a means for driving sense node based on the state of the input data signal when the clock signal changes state;
    a means for sensing completion of switching a state of the master storage element; and a means for stopping the driving of the sense node when switching of the state of the master storage element is completed.

15. The device of claim 14, further comprising a means for maintaining a state of the sense node when the clock signal is inactive.

16. the device of claim 15, wherein the means for maintaining the state of the sense node comprises a means for restoring charge to the sense node of the master storage element to maintain the state of the sense node.

17. The device of claim 15, wherein the means for maintaining the state of the sense node comprises a means for restoring charge to the sense node at a frequency less than the clock signal when the clock signal is inactive.

18. The device of claim 15, further comprising a means for compensating for capacitance introduced by the means for maintaining the state of the sense node.

19. The device of claim 14, wherein the means for gating pre-charging of the sense node further comprises a means for gating a supply potential of the master storage element as a function of the state of the clock signal.

* * * * *